United States Patent [19]

Maeda et al.

[11] 4,099,074
[45] Jul. 4, 1978

[54] TOUCH SENSITIVE ELECTRONIC SWITCHING CIRCUITRY FOR ELECTRONIC WRISTWATCHES

[75] Inventors: Hidetoshi Maeda; Toshihiro Ohba, both of Tenri, Japan

[73] Assignee: Sharp Kabushiki Kaisha, Osaka, Japan

[21] Appl. No.: 664,283

[22] Filed: Mar. 5, 1976

[30] Foreign Application Priority Data

Mar. 6, 1975 [JP] Japan .............. 50-31015[U]

[51] Int. Cl.² .............. H03K 3/353; H02H 9/04; G04B 19/00
[52] U.S. Cl. ................... 307/308; 58/23 A; 307/304; 361/56; 361/58
[58] Field of Search .............. 58/23 R, 23 A, 23 BA, 58/23 D, 50 R, 50 A; 307/116, 117, 118, 202, 304, 308; 317/16, 33 R, 33 SC, 31; 328/1, 4, 5; 361/56, 58

[56] References Cited

U.S. PATENT DOCUMENTS

| Re. 27,972 | 4/1974 | Borror et al. ............ 307/202 R X |
| 3,601,625 | 8/1971 | Redwine et al. ............ 307/304 X |
| 3,676,742 | 7/1972 | Russell et al. ............ 317/33 R |
| 3,712,995 | 1/1973 | Steudel ............ 307/304 |
| 3,934,159 | 1/1976 | Nomiya et al. ............ 307/304 |
| 3,947,727 | 3/1976 | Stewart ............ 317/31 |

OTHER PUBLICATIONS

RCA COS/MOS Integrated Circuits Manual; RCA/-Solid State Division; 6/1972; pp. 30–33.

Primary Examiner—Larry N. Anagnos
Attorney, Agent, or Firm—Birch, Stewart, Kolasch & Birch

[57] ABSTRACT

In a touch sensitive electronic switching circuit including a C-MOS inverter, for use in an electronic wristwatch, a resistor of about 5 MΩ is connected between the gate electrode of the C-MOS inverter and an input terminal associated with a touch sensitive electrode formed on a preferred position of the casing of the electronic wristwatch. The resistor of about 5 MΩ functions to prevent the C-MOS inverter from being damaged by an erroneous application of a high voltage to the touch sensitive electrode.

11 Claims, 3 Drawing Figures

TOUCH SENSITIVE ELECTRONIC SWITCHING CIRCUITRY FOR ELECTRONIC WRISTWATCHES

BACKGROUND OF THE INVENTION

The present invention relates to a touch sensitive electronic switching circuitry including a C-MOS inverter, for use in electronic wristwatches.

Recently, it has been proposed to provide a touch sensitive electronic switch in an electronic wristwatch because the touch sensitive electronic switch is simple in construction and operation as compared with the conventional mechanical switch such as a stem. Moreover, a switching circuitry for the touch sensitive electronic switch comprising a C-MOS inverter can be incorporated in an integrated circuit constituting a time calculation circuit of the electronic wristwatch.

In such a touch sensitive electronic switch system, a touch sensitive electrode is formed on a preferred position of the casing of the electronic wristwatch, for example, on the front glass window of the electronic wristwatch. Therefore, there is a possibility that a high voltage caused by, for example, a commercial power source may be applied to the touch sensitive electrode. This high voltage will damage the touch sensitive electronic switching circuitry including a C-MOS inverter, when the high voltage is directly applied to the switching circuitry. The touch sensitive electronic switch system described is the subject matter of prior copending application Ser. No. 575,731 filed May 8, 1975 by Sasaki and Maeda which is assigned to the same assignee as the present invention.

OBJECTS AND SUMMARY OF THE INVENTION

Accordingly, an object of the present invention is to enhance the reliability of a touch sensitive electronic switching circuitry comprising a C-MOS inverter, for use in electronic wristwatches.

Another object of the present invention is to prevent a C-MOS inverter or a touch sensitive electronic switching circuitry including a C-MOS inverter from being damaged by an erroneous application of a high voltage to a touch sensitive electrode associated with the touch sensitive electronic switching circuitry.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objectives, pursuant to an embodiment of the present invention, a resistor of about 5 MΩ is connected between the gate electrode of a C-MOS inverter included within a touch sensitive electronic switching circuitry and an input terminal of the touch sensitive electronic switching circuitry associated with a touch sensitive electrode formed on a preferred position of the casing of the electronic wristwatch, for example, on a front glass window of the electronic wristwatch. The resistor of about 5 MΩ functions to prevent the C-MOS inverter or the touch sensitive electronic switching circuitry from being damaged by an erroneous application of a high voltage to the touch sensitive electrode.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
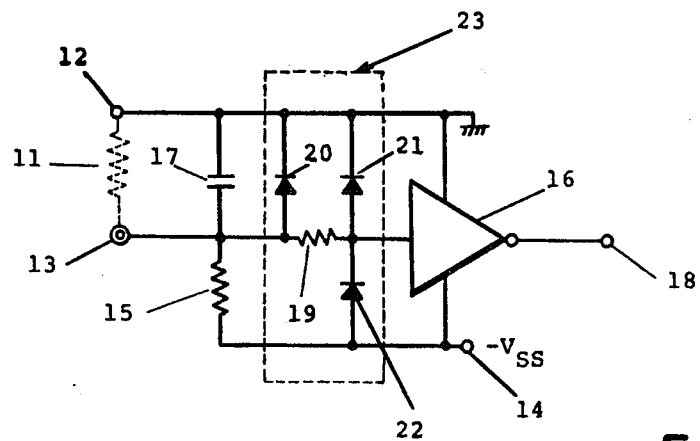
FIG. 1 is a circuit diagram of a touch sensitive electronic switching circuitry including gate protective circuitry in the C-MOS gate circuit of the copending application of Sasaki and Maeda.

Referring now in detail to the drawings, and to facilitate a more complete understanding of the present invention, a principal construction of a touch sensitive electronic switching circuitry employing a C-MOS inverter, for use in electronic wristwatches will be first described with reference to FIG. 1.

Input terminals 12 and 13 are connected to input electrodes formed on a metal rear frame of an electronic wristwatch and on a front glass window of the electronic wristwatch, respectively. One electrode formed on the metal rear frame is kept in contact with the operator's wrist when the operator wears the electronic wristwatch, and the other electrode formed on the front glass window is made of conductive, transparent film and is isolated from the metal rear frame. When the operator touches the transparent electrode formed on the front glass window by, for example, his hand opposite to the hand wearing the electronic wristwatch, the input terminals 12 and 13 are connected with each other through a resistor 11 caused by the operator's body.

When the input terminals 12 and 13 are connected with each other through the resistor 11 of the operator's body, a series circuit constituting of the resistor 11 of the operator's body and a pull-down resistor 15 is formed between the ground potential and a source terminal 14 connected to receive a negative potential $-V_{SS}$. Therefore, a gate input level $V_G$ of a C-MOS inverter 16 becomes identical with a voltage level divided by the resistor 11 and the pull-down resistor 15. In the normal condition, that is, when the input terminals 12 and 13 are not connected with each other via the resistor 11 of the operator's body, the gate input level $V_G$ of the C-MOS inverter 16 is maintained at approximately the negative potential $-V_{SS}$ via the pull-down resistor 15. Therefore, the gate input level $V_G$ of the C-MOS inverter 16 exceeds the threshold voltage level thereof when the divided voltage is applied thereto, whereby the switching circuitry detects the touch operation of the operator by inverting the condition of the C-MOS inverter 16.

A capacitor 17 and the pull-down resistor 15, in combination, form a filter circuit for inhibiting the introduction of the induced noise. An output terminal 18 of the C-MOS inverter 16 develops output signals of the touch sensitive electronic switching circuitry, which will be applied to other electronic circuitry employed in the electronic wristwatch as, for example, an indication demand or a time correction demand. A gate protective circuit 23 including a resistor 19 of around 500 Ω and diodes 20, 21 and 22 is disposed among the gate electrode of the C-MOS inverter 16, the source terminal 14, and the grounded terminal.

The gate protective circuit 23 of the prior art is effective for an instantaneous high voltage such as static electricity of 30 kilovolts. But the gate protective circuit 23 is not effective for an continuous high voltage created by, for example, a commercial power source. There is a possibility that a high voltage caused by, for example, a commercial power source is applied to the touch sensitive electronic switching circuitry because the input electrodes thereof are formed outside of the casing of the electronic wristwatch. This high voltage, when it is a positive one, will damage the diodes 20 and 21. When the high voltage is a negative one, the diode 22 will be damaged.

Figure 2:
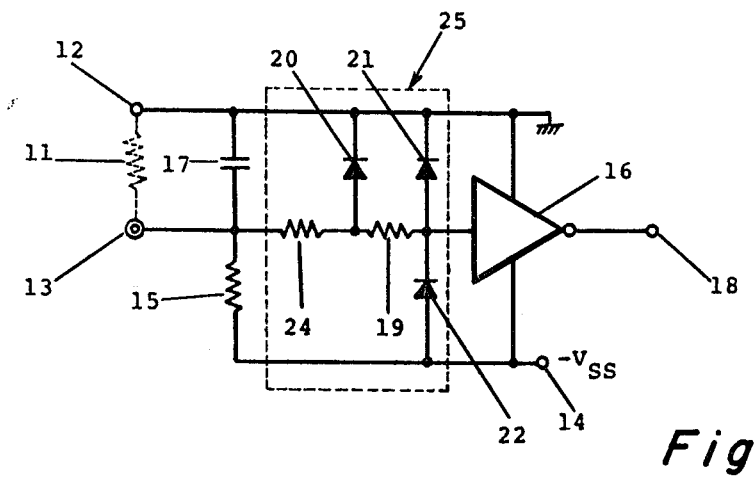
FIG. 2 is a circuit diagram of an embodiment of a touch sensitive electronic switching circitry of the present invention.

FIG. 2 shows an embodiment of the touch sensitive electronic switching circuitry of the present invention, wherein a high resistor is disposed between the input terminal and the above-mentioned gate protective circuit to prevent the gate protective circuit from being damaged by an erroneous application of the high voltage to the input electrode. Like elements corresponding to those of FIG. 1 are indicated by like numerals.

A gate protective circuit 25 of the embodiment shown in FIG. 2 further includes a high resistor 24 of about 4.7 MΩ. The high resistor 24 functions to limit an electric current flowing toward the diodes 20, 21 and 22, thereby protecting them from being damaged even when a high voltage is continuously applied to the input electrodes. The high resistor 24 also functions as the pull-down resistor, but it does not affect the logic value because the pull-down resistor 15 has a resistance value of 20 MΩ.

Figure 3:
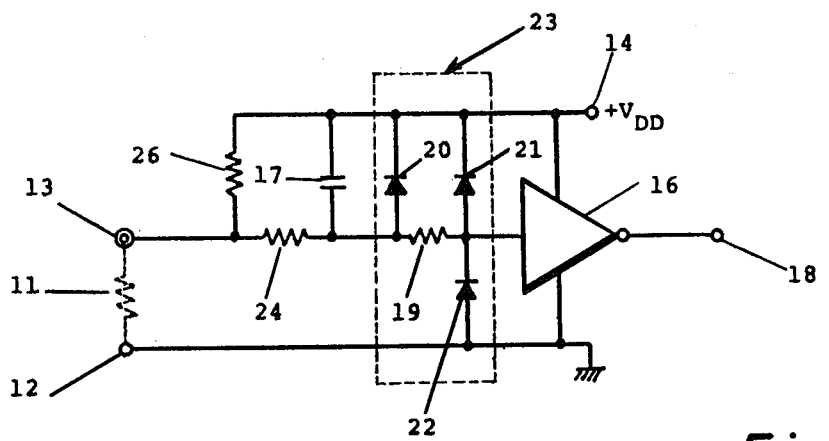
FIG. 3 is a circuit diagram of another embodiment of a touch sensitive electronic switching circuitry of the present invention.

FIG. 3 shows another embodiment of the touch sensitive electronic switching circuitry of the present invention. Like elements corresponding to those of FIGS. 1 and 2 are indicated by like numerals.

The embodiment of FIG. 3 is a pull-up type. A pull-up resistor 26 is disposed between the source terminal 14 connected to receive a positive voltage of $+V_{DD}$ and the input terminal 13 associated with the input electrode formed on the front glass window of the electronic wristwatch. The high resistor of about 4.7 MΩ is disposed between the input terminal 13 and the gate protective circuit 23 and, more particularly, in front of the capacitor 17. The high resistor 24 also functions to protect the gate protective circuit 23 from being damaged by an erroneous application of the high voltage to the input electrodes.

The invention being thus described, it will be obvious that the same may be varied in many ways. Such variations are not to be regarded as a departure from the spirit and scope of the invention, and all such modifications are intended to be included within the scope of the following claims.

What is claimed:

1. A touch sensitive electronic switching circuit for electronic wristwatches including a C-MOS inverter having a gate electrode, a pair of source electrodes, and a drain electrode, first and second input terminals for said C-MOS inverter across which an operator's body completes an electrical circuit to initiate switching of said D-MOS inverter from one state to another, a bias voltage source coupled to at least one of said source electrodes and to one of said first and second input terminals through a first resistor means, the other of said first and second input terminals being directly coupled to the other of said source electrodes, a gate protective circuit coupled between said gate electrode and the respective source electrodes, wherein the improvement comprises:

second resistor means in the gate circuit of said C-MOS inverter coupled between said first resistor means and said gate protective circuit for preventing damage to said gate protective circuit from an erroneous application of high voltage to said input terminals.

2. The touch sensitive electronic switching circuitry of claim 1, wherein said second resistor means has a resistance value of about 4.7 MΩ.

3. The touch sensitive electronic switching circuitry of claim 1, wherein one of said input terminals is formed on a front glass window of the electronic wristwatch.

4. The touch sensitive electronic switching circuit of claim 1, wherein said bias voltage source is at a negative potential and said other of said source terminals is grounded.

5. The touch sensitive electronic switching circuitry of claim 4, wherein the gate protective circuit comprises:

a third resistor disposed between the gate electrode of the C-MOS inverter and said second resistor means;

two diodes respectively disposed between the grounded terminal and the respective ends of the third resistor; and another diode disposed between the gate electrode of the C-MOS inverter and the source terminal coupled to said bias voltage.

6. The touch sensitive electronic switching circuit of claim 1, wherein said bias voltage source is at a positive potential and said other of said source terminals is grounded.

7. The touch sensitive electronic switching circuit of claim 6, wherein there is further provided a capacitor means coupled between said bias voltage source and a point in the gate circuit of said C-MOS inverter, said point being disposed between said second resistor means and said gate protective circuit.

8. The touch sensitive electronic switching circuitry of claim 6, wherein the gate protective circuit comprises:

a third resistor disposed between the gate electrode of the C-MOS inverter and said second resistor means;

two diodes disposed between the bias voltage source and the respective ends of the third resistor, respectively; and another diode disposed between the gate electrode of the C-MOS inverter and the grounded terminal.

9. The touch sensitive electronic switching circuit of claim 8, wherein there is further provided a capacitor means coupled between said bias voltage source and a junction point between said second resistor means and said third resistor.

10. The touch sensitive electronic switching circuit of claim 9, wherein the cathodes of said two diodes are coupled to said bias voltage source and the anodes are coupled to the respective ends of said third resistor, and said another diode has the cathode thereof coupled to said gate electrode and the anode coupled to said grounded electrode.

11. The touch sensitive electronic switching circuit of claim 6, wherein said second resistor means has a resistance value of about 4.7 MΩ.

* * * * *

UNITED STATES PATENT AND TRADEMARK OFFICE
CERTIFICATE OF CORRECTION

PATENT NO. : 4,099,074
DATED : July 4, 1978
INVENTOR(S) : Hidetoshi MAEDA et al

It is certified that error appears in the above–identified patent and that said Letters Patent are hereby corrected as shown below:

IN THE CLAIMS:

Claim 1, line 7, change "D-MOS" to read --C-MOS--.

Signed and Sealed this

First Day of May 1979

[SEAL]

Attest:

RUTH C. MASON
Attesting Officer

DONALD W. BANNER
Commissioner of Patents and Trademarks